United States Patent [19]

Deminet et al.

[11] 4,152,535
[45] May 1, 1979

[54] CONTINUOUS PROCESS FOR FABRICATING SOLAR CELLS AND THE PRODUCT PRODUCED THEREBY

[75] Inventors: Czeslaw Deminet, Kent; William E. Horne, Bellevue; Richard E. Oettel, Seattle, all of Wash.

[73] Assignee: The Boeing Company, Seattle, Wash.

[21] Appl. No.: 702,416

[22] Filed: Jul. 6, 1976

[51] Int. Cl.$^2$ .............................................. B08B 3/00
[52] U.S. Cl. .................................. 136/89 TF; 29/572; 148/1.5
[58] Field of Search ............................ 29/572; 136/89; 148/1.5, 1.5 CP

[56] References Cited

U.S. PATENT DOCUMENTS

| | | | |
|---|---|---|---|
| 3,571,915 | 3/1971 | Shirland | 29/572 |
| 3,585,088 | 6/1971 | Schwuttke | 148/1.5 CP |

OTHER PUBLICATIONS

Conf. Record, 11th IEEE Photospecialist Conf., May 6-8, 1975, "Polycrystalline Silicon Solar Cells . . . " by Chu et al., pp. 303-305.

*Primary Examiner*—W. Tupman
*Attorney, Agent, or Firm*—Cole, Jensen & Puntigam

[57] ABSTRACT

The process comprises the following steps: (1) forming a glass sheet which defines a substrate layer for the solar cell product; (2) forming a diffusion barrier layer on at least one surface of the substrate; (3) forming a first electrically-conductive layer on the diffusion barrier, the first electrically-conductive layer being a first electrode in the solar cell product; (4) depositing small-grain polycrystalline silicon in a thin film, i.e., 10-100 micrometers, on the first electrode layer; (5) recrystallizing, typically by heating, the deposited polycrystalline silicon until it reforms into large-grain polycrystalline or single-crystal silicon; (6) forming a PN junction in the recrystallized silicon layer; and (7) forming a second electrically-conductive layer on the recrystallized silicon layer, the second electrically-conductive layer being a second electrode in the solar cell product. The solar cell product produced by the above-process may be fabricated in large surface area configurations, suitable for terrestrial as well as extra-terrestrial use, at relatively low cost.

13 Claims, 5 Drawing Figures

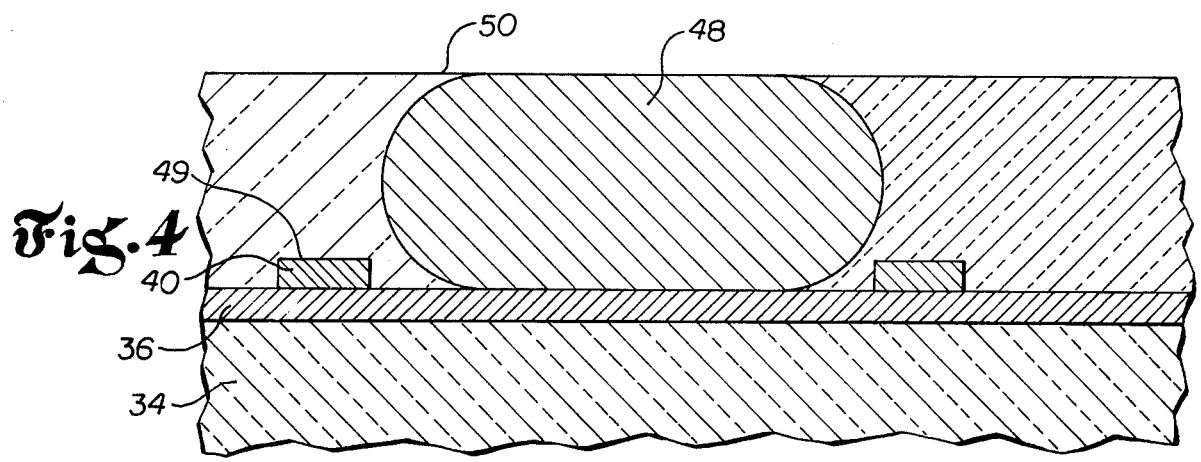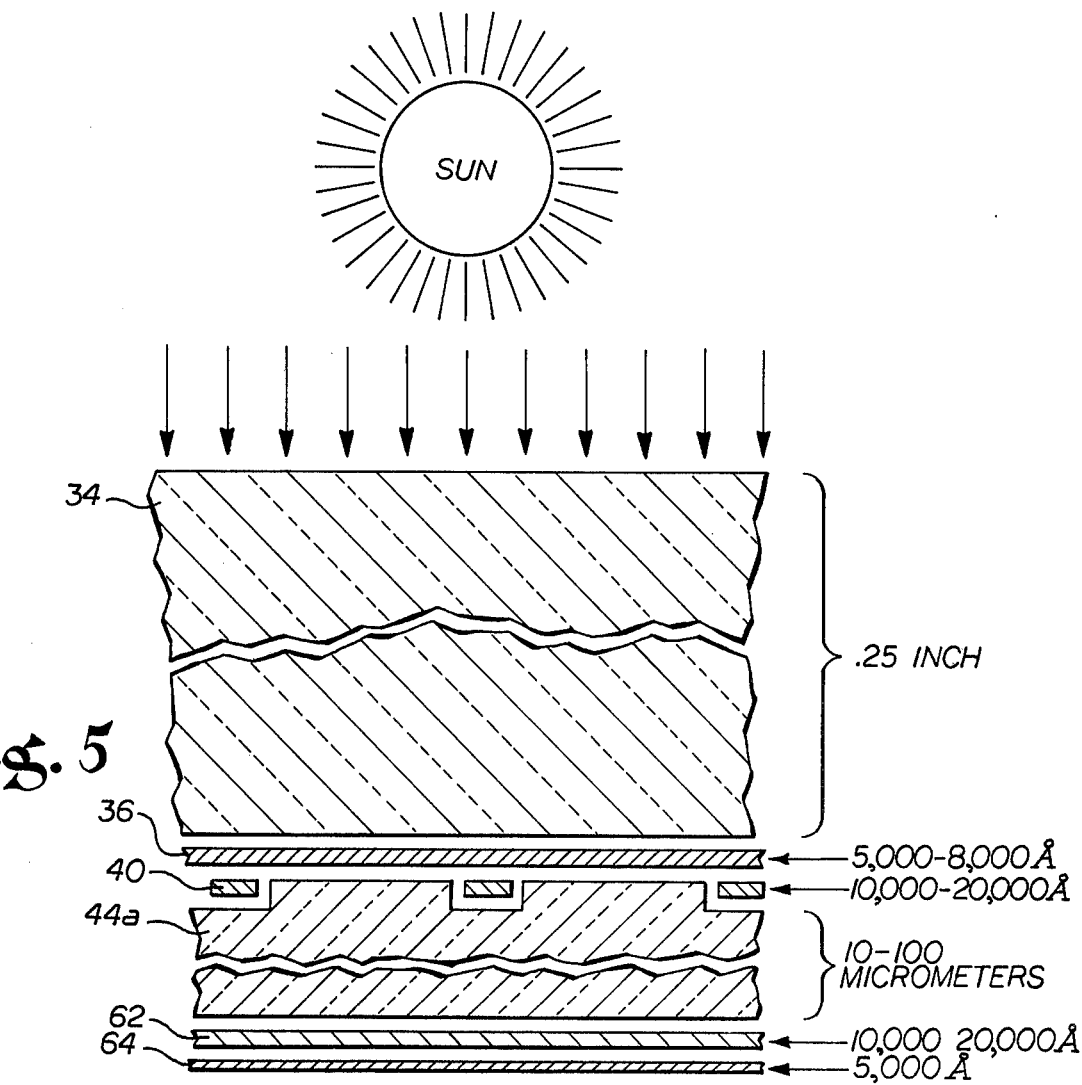

CONTINUOUS PROCESS FOR FABRICATING SOLAR CELLS AND THE PRODUCT PRODUCED THEREBY

BACKGROUND OF THE INVENTION

This invention relates generally to the semiconductor art, and more specifically is concerned with a process for manufacturing solar cells using semiconductor material.

With the increasing cost and potential restrictions on availability of conventional fuels, e.g., petroleum, natural gas, etc., as sources of energy, considerable research effort has been directed towards developing other sources of energy. Notable among alternative sources of energy is the sun. In attempting to make use of the sun's energy, a substantial amount of research effort has been directed toward developing inexpensive, large-capacity devices referred to as solar cells which directly transform the sun's energy which initially is in the form of photons into electricity.

A solar cell typically includes a layer of material having a photovoltaic capability, wherein electric charges present in the material are freed as a consequence of light impinging on the material. The freed electrical charges, when separated from the region of their generation, produce a current flow, which may be routed to an outside circuit and into an electrical load where work is performed.

Since the current produced by the solar cell continues only so long as light actually impinges on the cell, those applications which have continuous current demands require a separate subsystem for electrical storage. In other applications, however, continuous current is not necessary, and in those applications, the solar cell suffices by itself.

The photovotaic material used in solar cells must have two fundamental characteristics: (1) an inherent structural capability of producing mobile charge carriers in response to adsorption of light; and (2) an internal potential barrier by which the mobile charge carriers freed by the light can be separated from the region in which they are generated. Generally, most semiconductor materials fulfill the first requirement, and conventional PN junctions, as found in solid state diodes and transistors, fulfill the second requirement. In addition to these characteristics, the photovoltaic material used in a solar cell as a practical matter possess numerous other properties and characteristics which contribute to the efficiency of the device. Detailed information of the desirable characteristics of such materials for use in solar cells may be found in numerous standard texts such as *Solid State Physical Electronics*, by Aldert Vander Ziel, published by Prentice-Hall, Inc., 1957.

Generally, numerous materials and compounds are suitable for use in solar cells, among them being silicon, selenium, gallium arsenide, cadmium telluride, and copper sulfide, to specify but a few of the more prevalently used materials and compounds. Considerations of expense and efficiency indicate that the semiconductor material should be either single-crystal or large-grain polycrystalline rather than small-grain polycrystalline, and should be inexpensive and readily available. Silicon is such a material although even those solar cells which currently use silicon are too expensive to complete economically with other sources of electricity.

There are several reasons why solar cells using silicon are still too expensive to manufacture economically on a large scale. First, solar cells heretofore have been made in unit sizes by a batch process, instead of discrete sizes by a continuous process. Second, the solar cells now produced are relatively small, instead of large surface area configurations. Attempts to data to produce large area solar cells have resulted in poor quality and extremely fragile structures, which are easily damaged in use. Furthermore, severe manufacturing problems have been encountered in such attempts.

Third, the cost of producing large area thin-film single-cell silicon arrays, by the current method of slicing and polishing blocks of single crystal silicon is too expensive for commercial use. Previous attempts to deposit silicon in thin films of semiconductor quality suitable for use in solar cells have been unsuccessful. This lack of success is due to many factors, among the most important being (1) the deposited silicon acquires significant amounts of impurities in the manufacturing process, thereby substantially reducing the efficiency of the resulting solar cell, and (2) the grain size of the deposited silicon is too small to produce the necessary conversion efficiency for practical use.

These and other disadvantages have combined to detract from the attractiveness of the silicon solar cell as a significant alternative to present sources of electricity, even though the source of energy utilized by the solar cell is virtually inexhaustable and readily available.

Accordingly, it is one object of the present invention to provide a process for producing solar cells and the solar cell produced thereby which overcomes one or more of the disadvantages of the prior art specifically discussed above.

It is another object of the present invention to provide such a process which produces solar cells in large-area configurations.

It is a further object of the present invention to provide such a process which is adapted for continuous, rather than batch, process application.

It is yet another object of the present invention to provide such a process and product which minimizes the use of semiconductor material in the solar cell product.

It is a further object of the present invention to provide such a process and product wherein the semiconductor material may be deposited in small-grain polycrystalline form.

It is another object of the present invention to provide such a process wherein the deposited polycrystalline silicon is modified into large-grain or single-crystal silicon, thereby improving conversion efficiency of the solar cell product.

It is a still further object of the present invention to provide such a process and product wherein impurities are prevented from entering the semi-conductor material during the process.

It is another object of the present invention to provide such a process and product wherein the solar cell product is economically competitive with other sources of electricity.

SUMMARY OF THE INVENTION

Accordingly, the process of the present invention, which uses semiconductor material as the active element thereof, is particularly useful in producing solar cells. The steps of the process, in sequence, include: (a) forming a substrate; (b) forming a first electrode; (c) depositing a layer of semiconductor material so that one surface of the semiconductor layer is in ohmic contact with the first electrode, with the first electrode being positioned intermediate the substrate and the semiconductor layer; (d) recrystallizing the semiconductor layer in order to substantially increase its grain size to the point where it can economically function in a solar cell; (e) forming a PN junction in the recrystallized semiconductor layer; and (f) forming a second electrode so that it is in ohmic contact with another surface of the recrystallized semiconductor layer.

The solar cell produced by the above process is capable of providing a current output in response to light impinging on said recrystallized semiconductor layer. The solar cell so produced includes: (a) a substrate; (b) a deposited thin-film layer of semiconductor material having a grain size sufficiently large to economically function in a solar cell, the semiconductor layer having a PN junction formed therein; and (c) first and second electrically conductive electrodes positioned on opposite surfaces of the semiconductor layer and in ohmic contact therewith, the first electrode layer being substantially intermediate said substrate and said semiconductor layer.

The above process also includes a sequence of steps which in total form a subprocess thereof useful in producing semiconductor devices which use a semiconductor material as an active element. This sequence of steps includes: (a) forming a glass substrate, the glass substrate having substantially the same coefficient of expansion as the semiconductor material; (b) forming a first electrode; (c) depositing a layer of semiconductor material so that one surface thereof is in ohmic contact with the first electrode, the first electrode being positioned intermediate of the substrate and the semiconductor layer; and (d) recrystallizing the semiconductor layer so as to substantially increase its grain size to the point where it is of semiconductor quality.

DESCRIPTION OF THE DRAWINGS

A more thorough understanding of the invention may be obtained by a study of the following detailed description taken in conjunction with the accompanying drawings in which:

FIG. 4 is a cross-sectional view of a portion of a solar cell, showing in detail the structural effect of the step shown pictorially in FIG. 2, the step being accomplished by a proton beam.

FIG. 5 is an exploded cross-sectional view of a portion of the complete solar cell showing the structural configuration and relative preferred dimensions of the cell in a selected orientation thereof to the impinging energy from the sun.

DESCRIPTION OF THE PREFERRED EMBODIMENT

The process disclosed herein for the economical manufacture of large-area silicon solar cells is a sequential deposition process, wherein layers of various selected materials are sequentially deposited in a defined order upon a base material or substrate. Because it is a deposition process, rather than a variation of the slice and polish process which now dominates the solar cell prior art, many of the disadvantages of the prior art are inherently eliminated.

Figure 1:
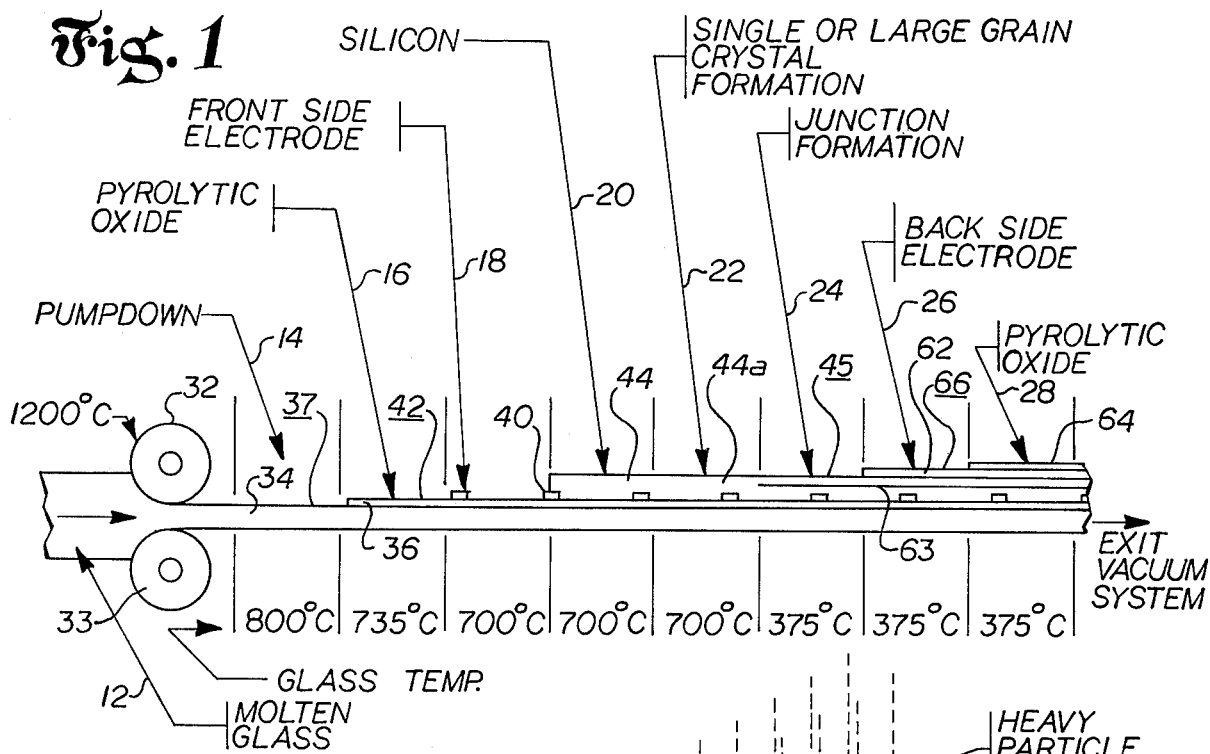
FIG. 1 is a side view of a portion of a large-area solar cell showing the sequential build-up of the successive layers of material which comprise the cell.

Furthermore, even those significant technical problems heretofore present in prior art deposition processes for making solar cells have been largely overcome by use of the sequence of steps explained in detail in the following paragraphs. Although the explanation of the process of the present invention is in terms of continuous production of large-area solar cells, it should be understood that virtually any size or configuration of solar cell may be produced by the present process in batch form as well. The fact that the present process is particularly adaptable to continuous production leads even more commercial attractiveness and practicality to the process than it would otherwise possess. FIG. 1 shows the sequential steps in the process of the present invention, from the formation of the glass substrate to the last oxide protective layer. Each sequential step is identified with a specific numeral to promote ease of identification and reference.

In the first step, reference 12, molten glass is presented between two rollers 32 and 33 to form a glass plate which serves as a substrate 34 for the solar cell product. The temperature of glass at this point is approximately 1200° C. Glass substrate 34 is preferably, but not necessarily thick enough, e.g., one-quarter inch, to provide solid support for the remaining layers of the solar cell, and to resist breakage in normal use, even for large area configurations. The thickness of substrate 34 is important in terrestrial applications; however, in extra-terrestrial (space) applications, substrate 34 may be made relatively thin, i.e., 250 micrometers.

Glass substrate 34 is also, of course, light transmitting, a necessary characteristic if the completed solar cell is to be oriented with substrate 34 toward the sun source. Glass is also generally preferable as the substrate material because of its insulating characteristics, its optical properties, its economy and availability.

Furthermore, glass has a coefficient of expansion which is very close to the coefficient of expansion of silicon active layer. This is important because both the substrate layer and the active layers, as well as the other layers, will expand and contract during the manufacturing process, because of the high temperatures involved. Under such temperature conditions, any substantial difference in the relative expansion characteristics of the substrate and the active layer, particularly in large-area configurations, will result in sufficient inter-layer stress to cause cracking of the substrate. Borosilicate glass has the required characteristics and has been found to function well in the present process. Other types of glass having the specified characteristics should be equally useful. After substrate 34 is formed by rollers 32 and 33, it enters a pumpdown chamber, reference 14, wherein the atmospheric pressure surrounding glass substrate 34 is reduced to a near vacuum. Several of the steps of the present process are performed in this near vacuum. Prior to entry of substrate 34 into the pumpdown chamber the temperature of glass substrate 34 is reduced to approximately 800° C. to prevent boiling of the glass in the near-vacuum atmosphere.

In the next step of the process, reference 16, which is accomplished in the near vacuum, a diffusion barrier layer 36 is deposited on upper surface 37 of glass substrate 34. Diffusion barrier layer 36 prevents impurities present in glass substrate 34 from migrating into the silicon active layer during the manufacturing process. Without such a diffusion barrier, the heat generated by the deposition of the silicon active layer, as well as other steps in the process, will result in the impurities present in the glass being diffused into the silicon active layer, substantially reducing its efficiency. If glass substrate 34, however, were free of impurities, diffusion barrier 36 would not be necessary.

In the preferred embodiment, diffusion barrier 36 is a pyrolytic oxide which is deposited on glass substrate 34 at relatively high temperatures. The oxide, being pyrolytic, decomposes at relatively high temperatures, well above the temperature of deposition and the temperature of any other process steps, so as to prevent any impurities in glass substrate 34 from migrating into diffusion barrier 36. Diffusion barrier 36 is preferably relatively thin, in the range of 5,000 to 8,000 angstroms (A), so as to minimize the possibility of its cracking from thermal stress during the remaining steps of the process. The oxide should itself be free from impurities to maintain the silicon layer impurity-free, and further should adhere well to both glass and silicon. A material which meets all of the above requirements is silicon dioxide, and this is the material used in the present process.

The next step in the process, reference 18, is the deposition of an electrically conductive first electrode 40 on top surface 42 of oxide barrier 36. Depending on the anticipated orientation of the completed solar cell relative to the sun, first electrode 40 may or may not be deposited in a pattern, typically in the form of strips of electrode material spaced a substantial distance apart. This spacing of the electrode strips permits the sun's rays to reach the silicon active layer. If the solar cell is to be oriented so that the glass substrate 34 is towards the sun, then first electrode 40 is deposited in such a pattern, which may be accomplished by well-known masking techniques. The pattern shown and described comprises a series of narrow strips of material, referred to as fingers, shown in cross-section in FIG. 1, which fingers proceed width-wise of the solar cell. The individual fingers are typically joined to each other at one end, respectively, by a bar (not shown), to which an electrode wire or other circuit means may conveniently be connected. The fingers and bar are electrically conductive and form the first electrode for the solar cell. Sufficient interfinger space remains, however, for a large percentage of the light from the sun impinging on glass substrate 34 to reach the silicon active layer.

In the embodiment shown and described, first electrode 40 is deposited in a near vacuum, by conventional techniques of deposition, in thickness typically in the range of 10,000–20,000 angstroms. The material comprising first electrode 40 is typically metal, preferably a metal having a high melting point (refractory) which is compatible with glass. Tungsten, tantalum and molybdenum have been successfully used. However, the electrodes need not necessarily be comprised of metal, as heavily doped silicon has also been used successfully.

The next step in the process, reference 20, is the desposition of small-grain polycrystalline silicon on top of first electrode 40. The silicon active layer also fills in between adjacent strips of patterned first electrode 40 and in those regions extends down to top surface 42 of diffusion barrier 36. As explained above, silicon is used as the active element in the process of the present invention because of its availability and relatively low cost. Other semiconductor materials and/or compounds, could, however, be successfully utilized in the process of the present invention. Silicon active layer 44 may be deposited in several ways. One technique which has been used is chemical-vapor-reduction of silicon tetrachloride, which must be accomplished in a controlled hydrogen atmosphere, since the reduction of silicon tetrachloride to pure silicon requires a source of hydrogen. Other techniques of silicon deposition, such as from silane, may be accomplished in a vacuum since a gaseous atmosphere is not required. Still other conventional techniques such as flame spray coating, sputtering, or vacuum evaporation may be used.

In the embodiment shown and described, silicon is deposited in small-grain polycrystalline form in thicknesses of 10–100 micrometers. When silicon is deposited, its crystalline structure is small grain, typically on the order of 1–10 micrometers. It is desirable, for economic reasons, that as little silicon as possible be used. Hence, the silicon active layer is deposited as a thin-film. The actual depth of the silicon active layer depends on several factors. A PN junction must be formed in the silicon active layer as explained in following paragraphs, but this step requires a thickness of only 1 micrometer. The depth of the silicon active layer primarily depends upon the desired efficiency of the solar cell. Silicon active layer 44, if 25 micrometers thick, will absorb approximately 80% of the incident photons, while a 100 micrometer thick silicon layer will absorb approximately 95% of the incident photons. Those solar cells having a silicon active layer less than 25 micrometers thick will have a correspondingly decreased efficiency, while the efficiency of solar cells having active layers thicker than 100 micrometers will increase from 95%, A practical range of active layer depth is 10–100 micrometers. The optimum trade-off between efficiency and cost for most applications will be found within that range.

Silicon layer 44 as deposited, however, is small-grain polycrystalline, and hence, unsuitable for use as is in a solar cell. In the next step of the process, reference 22, silicon layer 44 is melted and reformed into single-crystal or large-grain polycrystalline silicon, which increases the efficiency of the resulting solar cell to a practical level. As stated above, the silicon as deposited has a small-grain, i.e., several micrometers, crystalline structure. At this grain size, the efficiency of the silicon layer, for solar cell purposes, is extremely low. As the grain size increases, however, the efficiency of the active layer increases correspondingly, until grain sizes of 100 micrometers and larger are obtained, which are suitable for use in solar cells, and referred to as large-grain polycrystals.

The silicon layer 44, originally in small-grain polycrystalline form, may be remelted to form the desired single-crystal or large-grain polycrystalline silicon layer by several different means, among them being electron and/or laser beams. However, these two known methods have significant disadvantages in that their respective heating effects are produced not only in silicon layer 44, but also in first electrode layer 40, oxide barrier 36, and substrate 34. Such a technique is not only inefficient, but can cause migration of impurities present in any of the lower layers into the silicon active layer, thereby significantly diminishing its photovoltaic capability.

Additionally, the heat produced in the substrate will soften it, which presents significant problems in subsequent steps of the process, and affects the configuration and operation of the resulting solar cell. Additionally, such dispersed, penetrating heating has a cooling profile in the remelted silicon layer which proceeds from the base or bottom of the silicon layer toward its upper surface. Such a cooling profile tends to produce a small-grain, rather than a large-grain, crystal formation, due to the fact that the crystal structure of the remelted silicon tends to take on the crystal form of the material at which cooling begins. Hence since the cooling with such known techniques proceeds upwardly from the lower surface of silicon layer 44, which is adjacent first electrode 40 and substrate 34 which in turn are small-grain polycrystalline materials, the remelted silicon layer will also tend to be smaller grain than otherwise.

The present process, however, utilizes a heavy particle beam, typically, but not necessarily, a proton beam, in order to accomplish the melting and subsequent recrystallization of silicon layer 44. Significant control is achieved over the heating effect of the proton beam, since the penetration of heavy particles, such as protons, into solid material can be precisely calculated and controlled.

Figure 3:
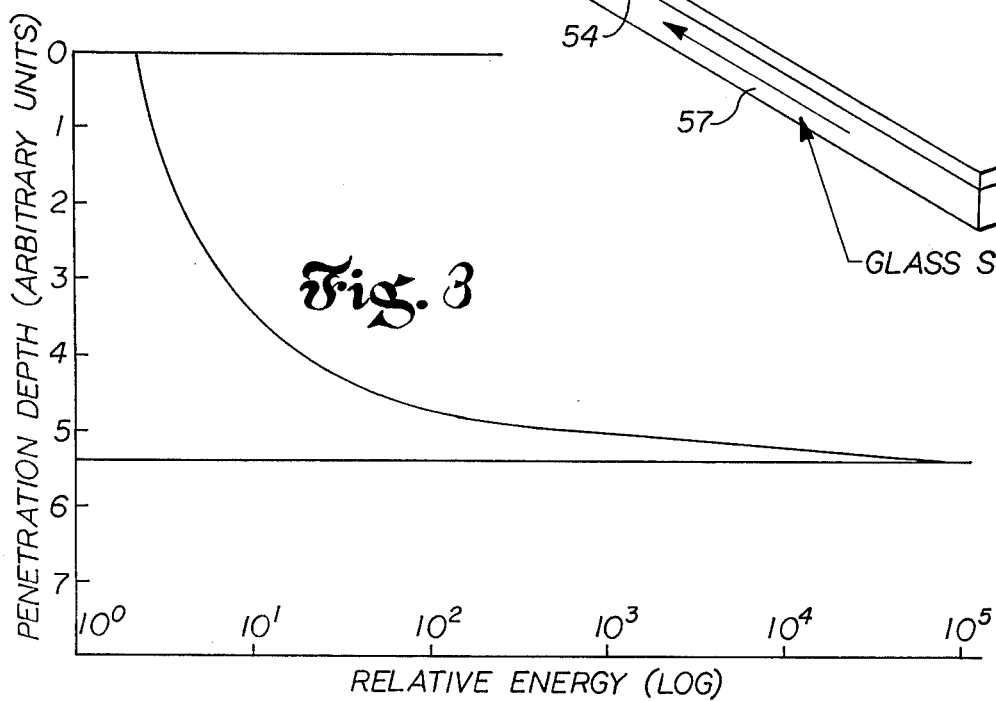
FIG. 3 is a graph showing the energy profile for a proton beam, a typical heavy particle beam, relative to its penetration depth in silicon.

FIG. 3 is a graph which plots the penetration depth of a proton beam against the logarithmic value of the beam energy. Not only is it possible to obtain a precise penetration depth by limiting the energy of the beam, but there also exists a maximum penetration depth for a particular material. The energy in the proton beam and the depth dimension of the silicon active layer are adjusted to result in a precisely defined depth of the molten region in silicon layer 44 during the heating (recrystallization) step.

FIG. 4 shows a cross-section of a molten region formed by a proton beam. The silicon is melted down to but not beyond the interface between silicon layer 44 and alternatively first electrode layer 40 or diffusion barrier 36. The precise shape of the molten region 48 is not known, although FIG. 4 is believed to be generally correct. The largest dimension of molten region 48 is concentrated at some specified depth, usually half-way between the upper and lower surfaces of silicon layer 44. Its width depends on the width of the heavy-particle beam, which in one embodiment is smaller than the distance between adjacent fingers of electrode 40 but larger than the width of those same fingers. The specific relative dimensions may be varied to accommodate the desires of the designer and the particular application.

The depth control over the heating effect of the proton beam eliminates the disadvantages of electron and-/or laser beams and produces a molten region having a cooling profile which proceeds from the top surface 50 of silicon layer 44 downward toward interface 49 between silicon layer 44 and first electrode layer 40 or diffusion barrier 36. This results in a tendency of the melted silicon to recrystallize in large-grain rather than small-grain polycrystalline form. Typically, the grain size is increased to at least 100 micrometers, with the melting accomplished by a heavy particle beam, for example, a proton beam. The grain size may even be increased to the point where it is a single-crystal.

Figure 2:
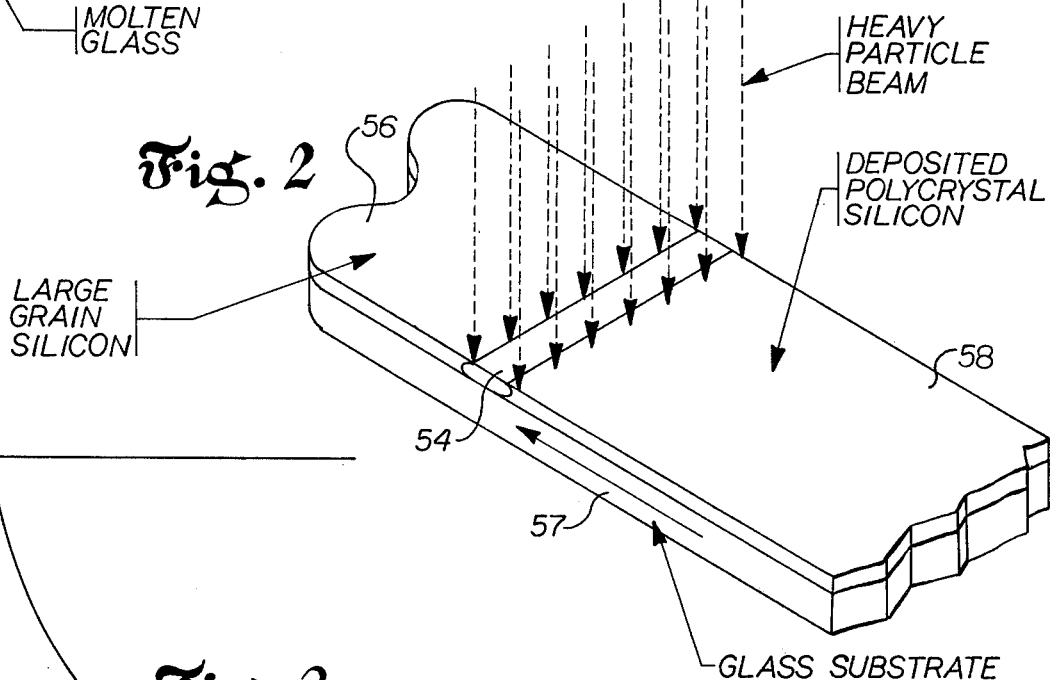
FIG. 2 is a pictorial view showing in more detail the particular step in the process of the present invention wherein the deposited small-grain polycrystalline silicon layer is melted to form a single-crystal or large-grain polycrystalline silicon layer.

In the embodiment shown and described, the proton beam defines a rather narrow line, e.g., 1 millimeter, across the entire width of silicon layer 44 (FIG. 2) and as silicon layer 44 and the proton beam move relative to each other, a molten region 54 forms in the silicon layer, taking the form of a narrow rectangle at the upper surface of the silicon layer. The molten region 54 moves longitudinally of silicon layer 44 and separates the deposited small-grain polycrystalline silicon region 58 from the reformed large-grain polycrystaline or single crystal silicon region 56, as glass substrate 57 is moved from right to left relative to the stationary proton beam.

This technique, referred to as a line scan process, has the advantage of a very high production capability, on the order of 25 to 50 square feet per hour. It also greatly reduces any existing impurities in the deposited silicon, as any impurities are collected and maintained in the molten region and hence continuously migrate away from the reformed large-grain polycrystalline silicon, leaving behind, in region 56, a relatively pure silicon in large-grain polycrystalline form. The reformed silicon layer is referenced 44a.

The next step, reference 24, is the formation of a PN junction in the now large-grain polycrystalline or single crystal silicon layer 44a. As explained briefly above, under conventional solar cell practice a PN junction is necessary in the photovoltaic conversion process since the charge carriers freed by the impinging light must be separated from their region of generation in order to produce a current.

A PN junction may be formed in large-grain silicon layer 44a as follows. In the present process, the silicon originally deposited is slightly doped N-type. Thus, silicon layer 44a is uniformly N-type material prior to the step referenced 24. The PN junction may be easily formed in the N-doped silicon layer 44a by doping silicon layer 44a with P-type dopant from the top surface 45 thereof to some specified depth, e.g., mid way of silicon layer 44a. In such a case, the bottom half of silicon layer is N-doped material and the top half P-doped, thus forming the required PN junction 63. Of course, the PN junction could be reversed, with the deposited silicon being initially doped P-type, with the top portion thereof being changed to N-type.

This step of forming the PN junction can be accomplished by any of several conventional techniques including diffusion, epitaxy, or ion implantation, although ion implantation may in some cases be preferred due to its precise control of the doping level and its adaptability to large scale production. The formation of the PN junction should be accomplished in a vacuum. The temperature of substrate 34 following the step of formation of the PN junction 63 will typically decrease from 700° C., which has been the temperature of the substrate during previous steps, to 375° C.

In the next step in the process, reference 26, a second electrode 62 is formed on the top surface 45 of reformed silicon layer 44a in which a PN junction 63 has been formed. This second electrode 62 is similar in characteristics and purpose to first electrode 40. It provides good ohmic contact to the top side of silicon layer 44a and is generally formed by conventional techniques such as vacuum evaporation or deposition. If first electrode 40 is patterned, then second electrode 62 will be solid and vice versa. This step is performed in a near vacuum, with substrate 34 typically being at a temperature of about 375° C.

In the last step in the process shown and described, reference 28, a light-transparent oxide layer 64 is applied to upper surface 66 of second electrode 62, to provide protection for the completed solar cell. As in several of the other steps, the oxide is conventionally deposited in a near vacuum, and the temperature of substrate 34 is approximately 375° C. Oxide layer 64 in the embodiment shown and described is relatively thin, on the order of 5,000 angstroms, and may be any one of a number of different oxides, including, but not limited to, a pyrolitic oxide similar to that of diffusion barrier layer 36. Oxide layer 64 has the primary purpose of protecting the reverse side of the solar cell.

The result of the process described above is a solar cell which is shown in exploded form in FIG. 5. The solar cell in FIG. 5 is oriented so that glass substrate 34 is closest to the sun, although the cell certainly would be operative if it were oppositely oriented, provided that the particular electrode which is between reformed silicon layer 44a and the sun is patterned so as to permit light from the sun to actually impinge upon the silicon layer. Briefly, for the embodiment shown and described, the completed solar cell comprises in sequence the following layers and their respective thicknesses: (1) a glass substrate, approximately ¼ inch (for terrestrial applications); (2) an oxide diffusion barrier, approximately 5,000–8,000 angstroms; (3) a first patterned electrode, approximately 10,000–20,000 angstroms; (4) a large-grain polycrystalline or single-crystal silicon active layer, having a PN junction formed therein, approximately 10–100 micrometers; (5) a second electrode, approximately 10,000–20,000 angstroms; and (6) a protective glass layer, approximately 5,000 angstroms. For space applications, where weight is critical, the glass substrate can be extremely thin, i.e., approximately 250 micrometers.

It should be understood that the individual steps of the process, explained in detail above, as well as the specific dimensions, especially thickness, of each layer define a preferred embodiment of a process and the product produced thereby. Several steps of the process, as well as many of the characteristics and dimensions of the resulting layers comprising the complete solar cell may be modified by men skilled in the art or perhaps even eliminated in specific applications, without detracting from the spirit of the invention, which is a process for inexpensively producing large-area solar cells, in which the semiconductive active element is initially deposited on a substrate in small-grain polycrystalline form. The small-grain polycrystalline layer is then melted in a precise, controlled manner to produce a large-grain polycrystalline or single crystal silicon layer, in which a PN junction is then formed. Electrodes or similar devices positioned strategically within the structure permit a current to flow when connected to a load.

Solar cells made by such a process may take various configurations, including one in which several silicon active layers are separated by electrode interfaces, so as to result in a stacked solar cell, increasing the efficiency and lowering the cost of the basic solar cell.

Other modifications or changes to the process and/or product described above can be accomplished by men skilled in the art in accordance with known techniques or processes, without departing from the spirit of the invention, which is defined by the claims which follow.

What is claimed is:

1. A process for making solar cells, comprising the steps:
   a. forming a substrate for the solar cell;
   b. forming a first electrode which is supported by said substrate;
   c. depositing a layer of small-grain semiconductor material, which is originally doped N or P, in such a manner that a first surface of said semiconductor layer is in electrical contact with said first electrode;
   d. recrystallizing said semiconductor material to increase its grain size to the point where said semiconductor layer may be used as the active element in a solar cell, while simultaneously removing substantially all electrically conducting impurities from said semiconductor material;
   e. doping the upper portion of said semiconductor layer opposite to said original doping, so as to form a PN junction in said semicondutor layer; and
   f. forming a second electrode in such a manner that it is in electrical contact with a second surface of the recrystallized semiconductor layer, the solar cell produced thereby being capable of providing a current output in response to light impinging on the recrystallized semiconductor layer.

2. The process of claim 1, wherein the step of recrystallization includes the step of melting a substantial portion of said semiconductor layer without heating the substrate sufficiently to result in migration of impurities from said substrate into said semiconductor layer.

3. The process of claim 2, wherein said substrate has a melting point which is no greater than that of said semiconductor layer.

4. The process of claim 2, wherein the step of recrystallization includes the step of forming a molten region in said semiconductor layer by heating, and the further step of moving said semiconductor layer and the means for recrystallization relative to each other, so that said molten region moves gradually along the entire said semiconductor layer, wherein the impurities in said semiconductor layer move with said molten region, leaving the recrystallized semiconductor layer behind the molten region substantially free of electrically conducting impurities.

5. The process of claim 4, wherein the molten region is relatively narrow and extends across said semiconductor layer.

6. The process of claim 5, wherein the step of forming the molten region includes heating said semiconductor layer by a heavy particle beam.

7. The process of claim 1, including the step of forming a diffusion barrier intermediate said substrate and said first electrode.

8. The process of claim 1, including the step of forming a protective layer on top of said second electrode.

9. The process of claim 3, wherein said substrate is glass and said semiconductor material is silicon.

10. The process of claim 9, wherein the glass substrate is maintained at a temperature sufficient for it to be malable but not molten.

11. The process of claim 8, which includes the step of placing the substrate into a near vacuum, in which the remaining steps of the process are carried out.

12. The process of claim 1, wherein the grain size of said semiconductor material is increased to at least 100 micrometers by the step of recrystallization.

13. The product which is produced by the process comprising the steps of:
   a. forming a substrate for the remainder of the solar cell;
   b. forming a first electrode which is supported by said substrate;
   c. depositing a layer of small-grain semiconductor material, which is originally doped N or P, in such a manner that a first surface of said semiconductor layer is in electrical contact with said first electrode;

d. recrystallizing said semiconductor material to increase its grain size to the point where said semiconductor layer may be used as the active element in a solar cell, while simultaneously removing substantially an electrically conducting impurities from said semiconductor material;

e. doping the upper portion of said semiconductor layer opposite to said original doping, so as to form a PN junction in said semiconductor layer; and f. forming a second electrode in such a manner that it is in electrical contact with a second surface of the recrystallized semiconductor layer, the solar cell produced thereby being capable of providing a current output in response to light impinging on the recrystallized semiconductor layer.

* * * * *

UNITED STATES PATENT AND TRADEMARK OFFICE
CERTIFICATE OF CORRECTION

PATENT NO. : 4,152,535
DATED : May 1, 1979
INVENTOR(S) : Czeslaw Deminet, et al

It is certified that error appears in the above–identified patent and that said Letters Patent are hereby corrected as shown below:

Column 11, line 7 -
The word "an" should be --all--.

Signed and Sealed this

Seventh Day of August 1979

[SEAL]

Attest:

Attesting Officer

LUTRELLE F. PARKER
Acting Commissioner of Patents and Trademarks